US011495445B2

(12) United States Patent
Uchida et al.

(10) Patent No.: US 11,495,445 B2
(45) Date of Patent: Nov. 8, 2022

(54) PLASMA PROCESSING APPARATUS AND PLASMA PROCESSING METHOD

(71) Applicant: Tokyo Electron Limited, Tokyo (JP)

(72) Inventors: Yohei Uchida, Miyagi (JP); Yusuke Mizuno, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/424,805

(22) Filed: May 29, 2019

(65) Prior Publication Data
US 2019/0371575 A1 Dec. 5, 2019

(30) Foreign Application Priority Data

May 30, 2018 (JP) .............................. JP2018-103143

(51) Int. Cl.
H01J 37/32 (2006.01)
H01L 21/687 (2006.01)

(52) U.S. Cl.
CPC .. H01J 37/32651 (2013.01); H01J 37/32495 (2013.01); H01J 37/32642 (2013.01); H01L 21/68735 (2013.01); H01J 2237/334 (2013.01)

(58) Field of Classification Search
None
See application file for complete search history.

(56) References Cited

U.S. PATENT DOCUMENTS

| 6,210,593 | B1* | 4/2001 | Ohkuni | G01L 9/0042 |
| | | | | 216/2 |
| 6,709,547 | B1* | 3/2004 | Ni | H01L 21/67069 |
| | | | | 156/345.51 |
| 2007/0111339 | A1* | 5/2007 | Wege | H01L 21/67069 |
| | | | | 438/10 |
| 2008/0236749 | A1* | 10/2008 | Koshimizu | H01J 37/32091 |
| | | | | 156/345.33 |
| 2009/0294064 | A1* | 12/2009 | Nagayama | H01J 37/32623 |
| | | | | 156/345.39 |
| 2017/0111339 | A1 | 4/2017 | Lee et al. | |
| 2017/0133234 | A1* | 5/2017 | Doba | H01J 37/32651 |
| 2017/0213758 | A1 | 7/2017 | Rice et al. | |
| 2017/0236741 | A1* | 8/2017 | Angelov | H01J 37/00 |
| | | | | 29/559 |
| 2018/0061696 | A1* | 3/2018 | D'Ambra | H01J 37/32642 |

FOREIGN PATENT DOCUMENTS

JP 3166974 U 3/2011

* cited by examiner

Primary Examiner — Jeffrie R Lund
Assistant Examiner — Tiffany Z Nuckols
(74) Attorney, Agent, or Firm — Venjuris, P.C.

(57) ABSTRACT

A plasma processing apparatus includes a processing chamber where a plasma processing is performed on a workpiece, a stage, an edge ring, a shield, and a driver. The stage has a placement surface on which the workpiece is placed inside the processing chamber. The edge ring is provided around the stage so as to surround the workpiece on the placement surface. The shield is capable of shielding a portion of the surface of the edge ring from plasma generated in the processing chamber. The driver changes the area of the edge ring exposed to the plasma by moving the shield relative to the edge ring.

19 Claims, 10 Drawing Sheets

PLASMA PROCESSING APPARATUS AND PLASMA PROCESSING METHOD

CROSS-REFERENCE TO RELATED APPLICATIONS

This application is based on and claims priority from Japanese Patent Application No. 2018-103143, filed on May 30, 2018 with the Japan Patent Office, the disclosure of which is incorporated herein in its entirety by reference.

TECHNICAL FIELD

Various aspects and embodiments disclosed herein relate to a plasma processing apparatus and a plasma processing method.

BACKGROUND

In a plasma processing apparatus that processes a semiconductor wafer (hereinafter, referred to as a "wafer") by plasma, the wafer is mounted on a stage disposed inside a processing chamber. The stage is provided with an edge ring (also referred to as a "focus ring") made of a conductive material so as to surround a wafer placed on a placement surface. By providing the edge ring around the wafer, it is possible to improve the uniformity of a processing on the wafer by suppressing deviation of the distribution of plasma between the vicinity of the center of the wafer and the vicinity of the edge. See, for example, Japanese Utility Model No. 3166974.

SUMMARY

An aspect of the present disclosure is a plasma processing apparatus including a processing chamber where a plasma processing is performed on a workpiece, a stage, an edge ring, a shield, and a driver. The stage has a placement surface on which the workpiece is placed inside the processing chamber. The edge ring is provided around the stage so as to surround the workpiece on the placement surface. The shield is capable of shielding a portion of the surface of the edge ring from plasma generated in the processing chamber. The driver is capable of changing the area of the edge ring exposed to the plasma by moving the shield relative to the edge ring.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of the disclosed plasma processing apparatus and plasma processing method will be described in detail with reference to the drawings. The disclosed plasma processing apparatus and plasma processing method are not limited by the following embodiments.

[Configuration of Plasma Processing Apparatus 100]

Figure 1:
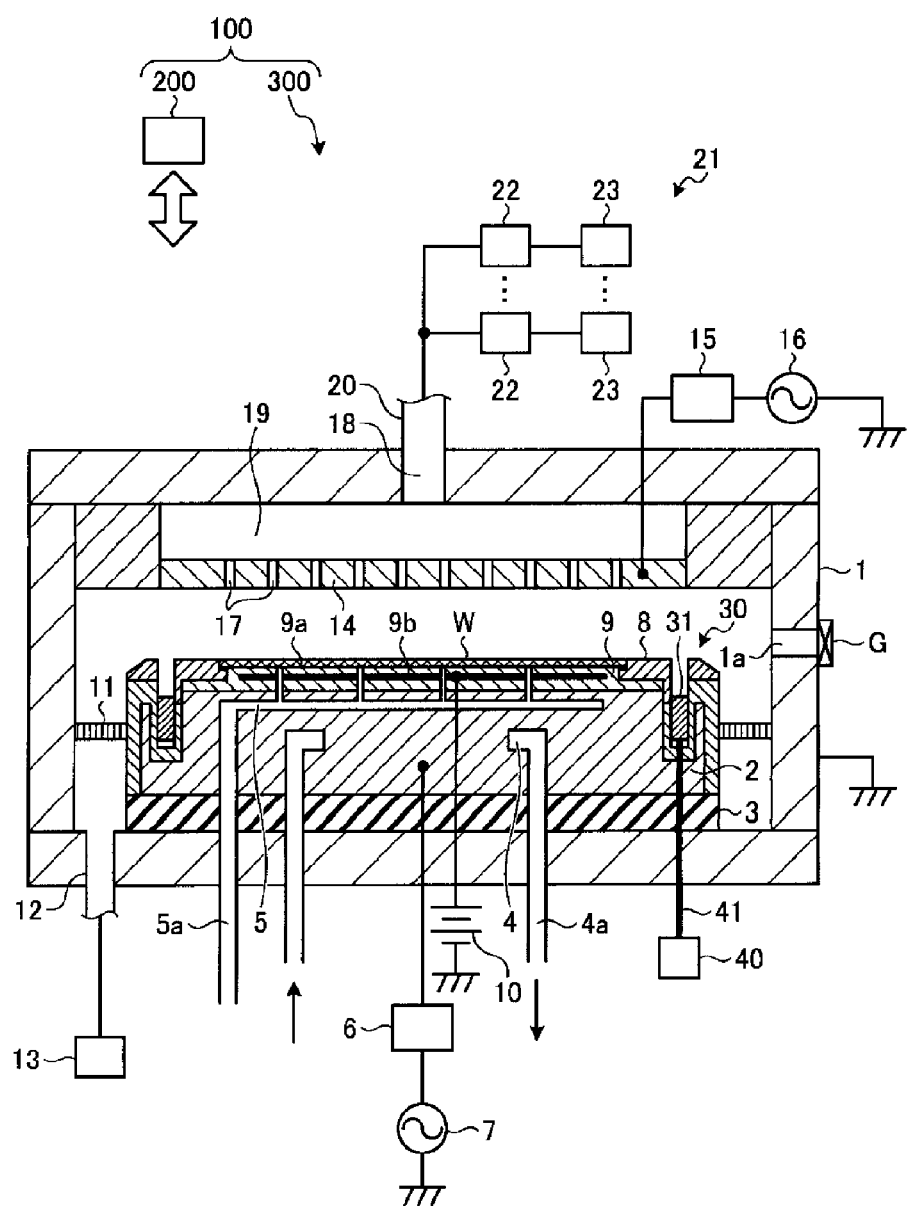
FIG. 1 is a schematic cross-sectional view illustrating an exemplary plasma processing apparatus according to an embodiment of the present disclosure.

FIG. 1 is a schematic cross-sectional view illustrating an exemplary plasma processing apparatus 100 according to an embodiment of the present disclosure. For example, as illustrated in FIG. 1, the plasma processing apparatus 100 includes a control device 200 and an apparatus body 300. The apparatus body 300 includes a cylindrical chamber 1 which constitutes a processing chamber the interior of which is configured to be hermetically closed. The chamber 1 is made of, for example, aluminum, and is grounded for safety. An opening 1a is formed in the side wall of the chamber 1 to carry a wafer W, which is an exemplary workpiece, into the chamber 1, and the opening 1a is opened and closed by a gate valve G. A base 2 functioning as a lower electrode is provided inside the chamber 1. The base 2 is formed of, for example, a metal such as aluminum.

The base 2 is supported on the bottom of the chamber 1 via an insulating plate 3 such as, for example, ceramic. On the upper surface of the base 2, an electrostatic chuck 9 made of an insulator in which an electrode 9b is embedded is provided. The electrode 9b is connected to a DC power supply 10. The electrostatic chuck 9 attracts and holds the wafer W on the holding surface 9a in the upper surface thereof by a Coulomb force generated by the DC voltage applied from the DC power supply 10 to the electrode 9b. The electrostatic chuck 9 is an exemplary stage, and the holding surface 9a of the electrostatic chuck 9 is an exemplary placement surface of the stage.

A flow path 4 is formed in the base 2 to circulate an insulating fluid. The flow path 4 is connected to a temperature control device such as, for example, a chiller unit (not illustrated) via a pipe 4a. The base 2 is controlled to a predetermined temperature by circulating a fluid controlled to a predetermined temperature in the flow path 4. The heat of the base 2 is transferred to the electrostatic chuck 9 which is in contact with the base 2.

In addition, a flow path 5 is provided in the base 2 to supply a heat transfer gas such as, for example, helium gas to the electrostatic chuck 9. The flow path 5 is connected to a heat transfer gas source (not illustrated) via the pipe 5a. The heat transfer gas supplied to the electrostatic chuck 9 through the pipe 5a and the flow path 5 is supplied between the holding surface 9a of the electrostatic chuck 9 and the lower surface of the wafer W. By controlling the pressure of the heat transfer gas supplied to the space between the holding surface 9a of the electrostatic chuck 9 and the lower surface of the wafer W, it is possible to control the heat transfer rate between the electrostatic chuck 9 and the wafer W. By controlling the temperature of the fluid circulating in the flow path 4 in the base 2 and the pressure of the heat transfer gas supplied to the space between the holding surface 9a of the electrostatic chuck 9 and the lower surface of the wafer W, it is possible to control the temperature of the wafer to a predetermined temperature.

A radio-frequency power supply 7 is connected to the base 2 via a matcher 6. The radio-frequency power supply 7 applies radio-frequency power having a frequency capable of generating a self-bias to the base 2 via the matcher 6. By supplying the radio-frequency power from the radio-frequency power supply 7 to the base 2, ions are drawn into the wafer W placed on the electrostatic chuck 9.

In addition, as illustrated in FIG. 1, for example, the apparatus body 300 has an edge ring 8 provided around the electrostatic chuck 9 so as to surround the wafer W placed on the holding surface 9a of the electrostatic chuck 9. The edge ring 8 is formed of a conductive material such as, for example, silicon, carbon, or SiC, for example, in a ring shape. The edge ring 8 improves the uniformity in plasma processing on the wafer W. The edge ring 8 has a shape that follows the outer shape of the wafer W in a plan view. In the present embodiment, the wafer W has a substantially disc shape, and the edge ring 8 has a substantially cylindrical shape in a plan view.

In addition, a cover structure 30 having a shielding member 31 is disposed on the outer periphery of the edge ring 8. The shielding member 31 is provided around the edge ring 8 so as to surround the edge ring 8, and is supported by a support rod 41. A driving device 40 may move the support bar 41 in a direction following the normal to the holding surface 9a of the electrostatic chuck 9 (e.g., a vertical direction). As the support bar 41 moves up and down by the driving device 40, the shielding member 31 moves up and down. The driving device 40 is an exemplary changing unit. The shielding member 31 is a substantially cylindrical member having a shape along the outer shape of the edge ring 8 in a plan view. In the present embodiment, the upward movement of the shielding member 31 increases the area of the side surface of the edge ring 8 covered by the shielding member 31. In addition, in the example of FIG. 1, although the shielding member 31 is supported by one support rod 41, the shielding member 31 is supported by three or more support rods 41 in fact. The detailed structure of the cover structure 30 will be described later.

Further, an exhaust ring 11 formed in an annular shape is provided on the outer periphery of the cover structure 30. The exhaust ring 11 is provided with a number of exhaust holes penetrating the exhaust ring 11 in the thickness direction. An exhaust port 12 is provided in the bottom portion of the chamber 1, and an exhaust device 13 such as, for example, a vacuum pump is connected to the exhaust port 12. By operating the exhaust device 13, the gas in the chamber 1 is capable of being exhausted through the exhaust ring 11 and the exhaust port 12, and the interior of the chamber 1 is capable of being decompressed to a predetermined degree of vacuum.

A shower head 14 is provided in the ceiling portion of the chamber 1 above the electrostatic chuck 9 so as to face the base 2. The shower head 14 is made of, for example, a conductive material such as, for example, aluminum of which the surface is anodized. The shower head 14 is supported on the side wall of the chamber 1 via an insulating material. The shower head 14 and the base 2 function as a pair of electrodes (an upper electrode and a lower electrode). Further, a radio-frequency power supply 16 is connected to the shower head 14 via a matcher 15. The radio-frequency power supply 16 applies radio-frequency power having a frequency capable of generating plasma in the chamber 1 to the shower head 14 via the matcher 15. As a result, a radio-frequency electric field is formed in the space between the shower head 14 and the base 2, the gas supplied into the chamber 1 is plasmatized, and thus plasma is generated in the chamber 1.

A diffusion chamber 19 is formed inside the shower head 14, and a large number of gas ejection ports 17 are provided in the lower surface of the shower head 14. A gas inlet 18 is provided above the shower head 14, and one end of a gas supply pipe 20 is connected to the gas inlet 18. The other end of the gas supply pipe 20 is connected to a gas supply 21. The gas supply 21 is provided with one or more sets of flow rate controllers 22 such as, for example, mass flow controllers, and a gas supply source 23 for supplying, for example, a processing gas for etching. The flow rate of the gas supplied from each of the gas supply sources 23 is controlled by a flow rate controller 22, and is supplied into the diffusion chamber 19 of the shower head 14 through the gas supply pipe 20 and the gas inlet 18. The gas supplied into the diffusion chamber 19 diffuses in the diffusion chamber 19, and is supplied in the form of a shower from the respective gas discharge ports 17 into the chamber 1.

The control device 200 has a memory and a processor. The processor in the control device 200 controls each part of the apparatus body 300 by reading and executing a program or a recipe stored in the memory in the control device 200.

[Details of Cover Structure 30]

Figure 2:
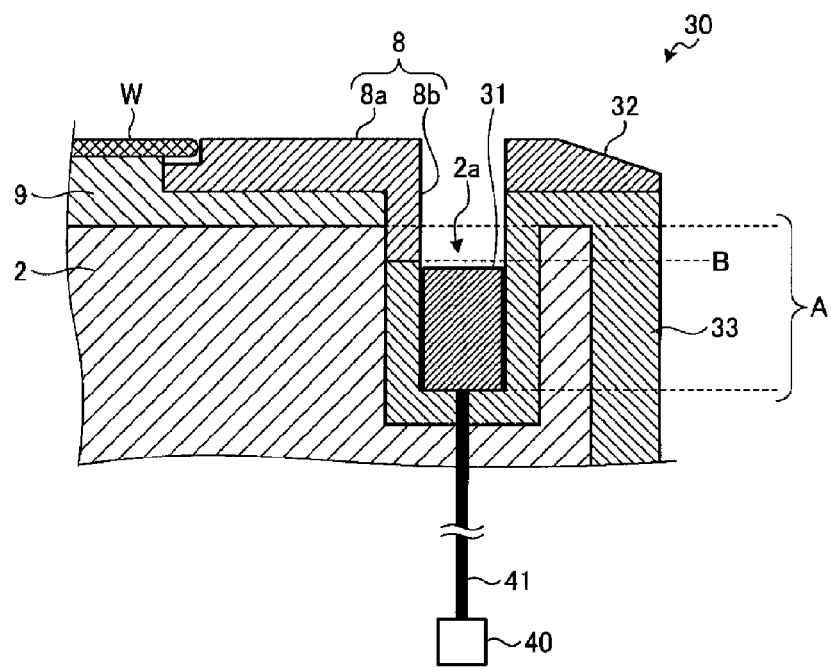
FIG. 2 is an enlarged cross-sectional view illustrating an exemplary cover structure.

FIG. 2 is an enlarged cross-sectional view illustrating an exemplary cover structure 30. As illustrated in FIG. 2, the cover structure 30 has, for example, a shielding member 31, a cover member 32, and a cover member 33. The shielding member 31, the cover member 32, and the cover member 33 are made of, for example, an insulator such as, for example, quartz. The cover member 32 is disposed on the upper surface of the cover member 33, and protects the upper surface of the cover member 33. The cover member 33 is provided along the outer side surface of the base 2 so as to cover the outer side surface of the base 2. In addition, the cover member 33 is provided along a recess 2a so as to cover the recess 2a annularly formed on the upper surface in the vicinity of the outer periphery of the base 2.

In the present embodiment, the shielding member 31 is accommodated in the recess 2a. Since the base 2 is formed of, for example, a metal such as, for example, aluminum, a potential gradient is smaller in the area A of the recess 2*a* than in the outside of the recess 2*a*. Therefore, it is possible to suppress abnormal discharge occurring in the space in which the shielding member 31 is accommodated.

In addition, in the present embodiment, the edge ring 8 has a substantially cylindrical shape. As illustrated in FIG. 2, the edge ring 8 includes, for example, a first ring portion 8*a* and a second ring portion 8*b*. The first ring portion 8*a* extends in a direction along the holding surface 9*a* of the electrostatic chuck 9 in the cross section taken along a plane along the central axis of the edge ring 8. The second ring portion 8*b* extends in the direction along the central axis of the edge ring 8 in the cross section taken along the central axis of the edge ring 8. The driving device 40 changes the area of the side wall of the second ring portion 8*b* exposed to the plasma generated in the chamber 1 by moving the shielding member 31 along the central axis of the edge ring 8.

The shielding member 31 is retracted below the height B of the lower end of the second ring portion 8*b* in the state where the support rod 41 is retracted to the lowermost position. Therefore, the side surface of the second ring portion 8*b* is not covered by the shielding member 31 in the state in which the support rod 41 is retracted to the lowermost position. Meanwhile, when the shielding member 31 moves up and the upper end of the shielding member 31 moves upward from the height B of the lower end of the second ring portion 8*b* by raising the support rod 41 by the driving device 40, a portion of the side surface of the second ring portion 8*b* is covered. Then, as the shielding member 31 moves upward by the driving device 40, the area of the side surface of the second ring portion 8*b* covered by the shielding member 31 increases.

[Change of Incident Direction of Ions]

Figure 3A:
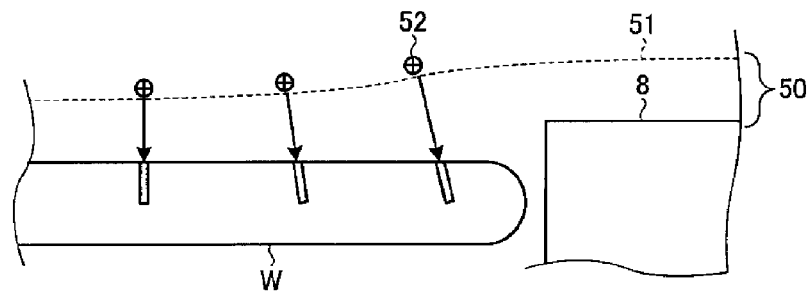
FIG. 3A is a diagram illustrating an exemplary distribution of the boundary of a sheath near the edge of a wafer.

Here, when the height of the boundary 51 of the sheath area 50 above the wafer W is higher than the height of the boundary 51 of the sheath area 50 above the edge ring 8, the boundary 51 of the sheath area 50 is distributed, for example, as illustrated in FIG. 3A. In this case, in the vicinity of the edge of the wafer W, the incident direction of ions 52 in the plasma is inclined to the edge side of the wafer W.

Figure 3B:
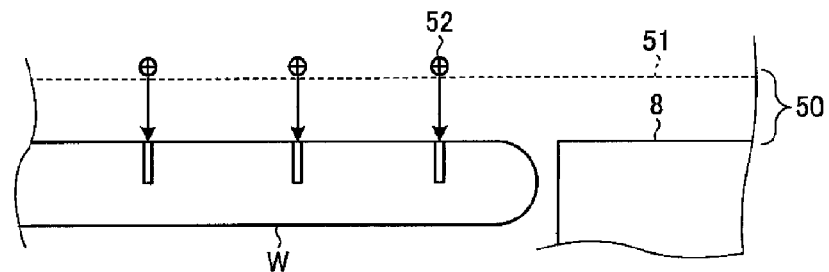
FIG. 3B is a diagram illustrating an exemplary distribution of the boundary of a sheath near the edge of a wafer.

In addition, when the height of the boundary 51 of the sheath area 50 above the wafer W is substantially the same as the height of the boundary 51 of the sheath area 50 above the edge ring 8, the boundary 51 of the sheath area 50 is distributed, for example, as illustrated in FIG. 3B. In this case, even in the vicinity of the edge of the wafer W, the incident direction of ions 52 in the plasma is substantially perpendicular to the wafer W.

Figure 3C:
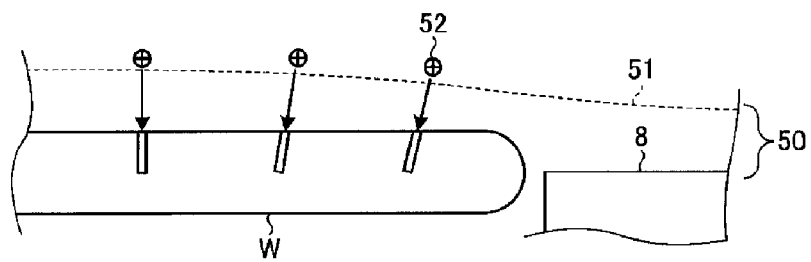
FIG. 3C is a diagram illustrating an exemplary distribution of the boundary of a sheath near the edge of a wafer.

In addition, when the height of the boundary 51 of the sheath area 50 above the wafer W is lower than the height of the boundary 51 of the sheath area 50 above the edge ring 8, the boundary 51 of the sheath area 50 is distributed, for example, as illustrated in FIG. 3C. In this case, in the vicinity of the edge of the wafer W, the incident direction of ions 52 in the plasma is inclined to the center side of the wafer W.

In the following description, the inclination of an etching shape (e.g., a hole) is defined as a tilt angle, and the direction substantially perpendicular to the main surface of the wafer W is defined as 0 degrees. For example, the case in which a hole is inclined toward the edge side of the wafer W with respect to the main surface of the wafer W, for example, as illustrated in FIG. 3A, is defined as a positive angle, and the case in which a hole is inclined toward the center side of the wafer W with respect to the main surface of the wafer W, for example, as illustrated in FIG. 3C, is defined as a negative angle. In, the case of FIG. 3A is defined as outer tilting, and the case of FIG. 3C is defined as inner tilting.

With the lapse of time in which the plasma processing is performed, the edge ring 8 exposed to the plasma is consumed. As the edge ring 8 is consumed, the height of the boundary 51 of the sheath area 50 above the edge ring 8 is reduced. As a result, the boundary 51 of the sheath area 50 is distributed, for example, as illustrated in FIG. 3C, and eventually, the inclination of holes formed in the wafer W does not satisfy a specification. Therefore, the edge ring 8 is replaced before the inclination of the holes formed in the wafer W does not satisfy the specifications.

[Relationship Between Shape of Edge Ring 8 and Incident Direction of Ions]

Figure 4:
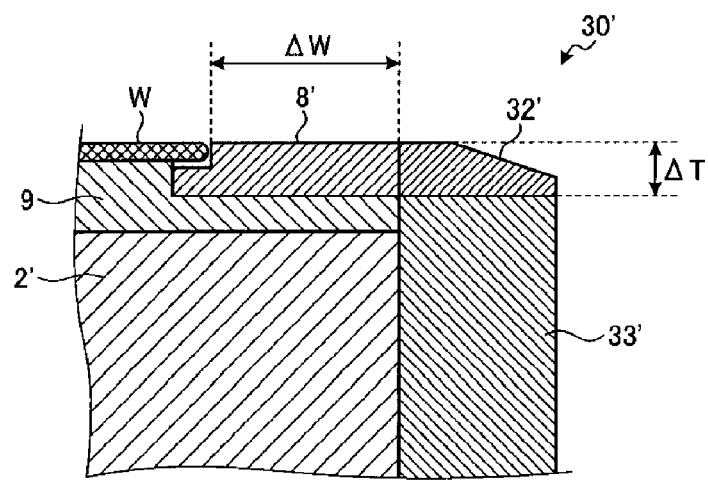
FIG. 4 is a cross-sectional view illustrating an exemplary cover structure used in a test.

Next, tests were conducted on the relationship between the shape of the edge ring 8 and the incident direction of ions 52. In the tests, for example, a cover structure 30' illustrated in FIG. 4 was used. FIG. 4 is a cross-sectional view illustrating an exemplary cover structure 30' used in the tests. In the following tests, edge rings 8' having different widths ΔW and thicknesses ΔT were used.

Figure 5:
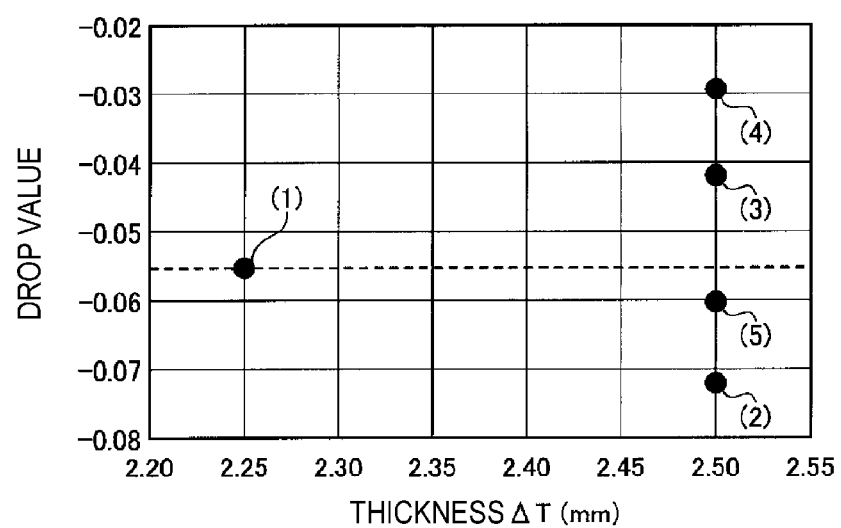
FIG. 5 is a diagram representing exemplary drop values when the width and thickness of an edge ring are changed.

FIG. 5 is a diagram representing exemplary drop values when the thicknesses and widths of the edge rings 8 were changed. A drop value is, for example, a value represented by the following calculation formula.

Drop value={ER(149 mm)/ER(0 mm)}−{ER(135 mm)/ER(0 mm)}

In the above calculation formula, ER(X mm) represents the etching rate at a position X mm away from the center of a wafer W.

In FIG. 5, the widths ΔW and the thicknesses ΔT of edge rings 8' at the plots of (1) to (4) are as follows.

ΔW=60 mm, ΔT=2.25 mm (1):

ΔW=60 mm, ΔT=2.5 mm (2):

ΔW=70 mm, ΔT=2.5 mm (3):

ΔW=80 mm, ΔT=2.5 mm (4):

As represented at plots (1) and (2) of FIG. 5, even if the widths ΔW of the edge rings 8' are the same, the drop values decrease as the thicknesses ΔT of the edge rings 8' decrease. Plot (2) in FIG. 5 corresponds to the drop value when the edge ring 8' in the initial state is used, and plot (1) in FIG. 5 is corresponds to the drop value when the edge ring 8' consumed by the execution of the plasma processing. As represented at plots (2) to (4) in FIG. 5, even if the widths ΔW of the edge rings 8' are the same, the drop value decreases as the widths ΔW of the edge rings 8' decrease.

Figure 6:
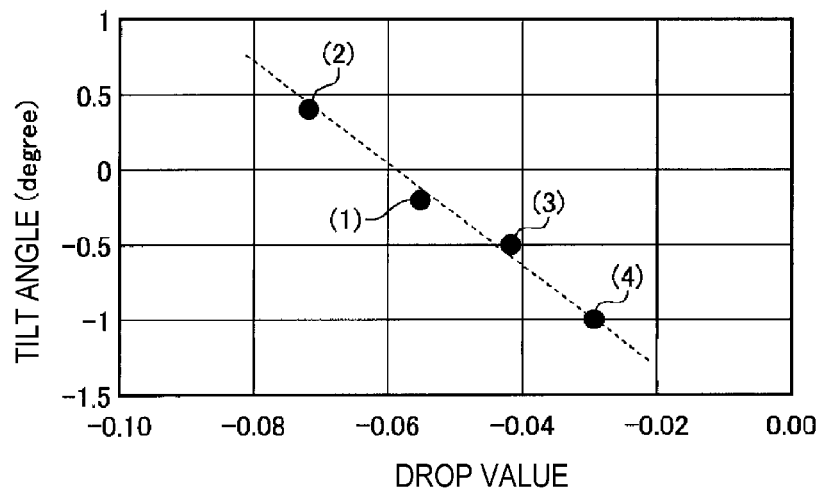
FIG. 6 is a diagram representing an exemplary relationship between drop values and tilt angles.

When plots (1) to (4) of FIG. 5 are converted into tilt angles corresponding to the drop values and plotted, they become, for example, as illustrated in FIG. 6. FIG. 6 is a diagram representing an exemplary relationship between drop values and tilt angles. For example, as represented in FIG. 6, as the drop values decrease, the tilt angles increase in the positive direction, resulting in outer tilting (see, e.g., FIG. 3A). For example, as represented in FIG. 6, as the drop values increase, the tilt angles increase in the negative direction, resulting in inner tilting (see, e.g., FIG. 3C).

Figure 7:
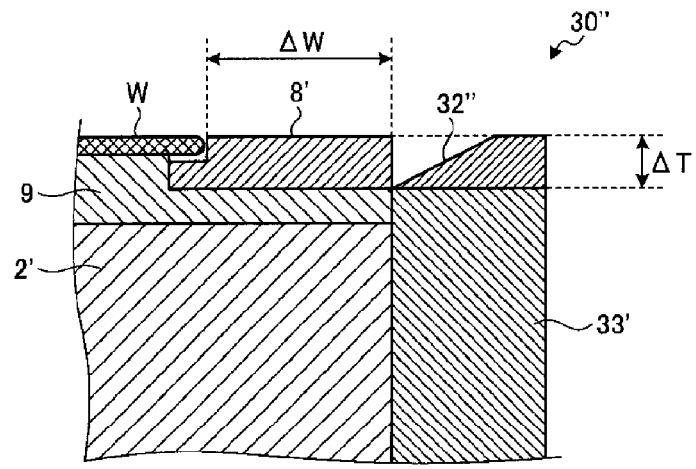
FIG. 7 is a cross-sectional view illustrating an exemplary cover structure used in a test.

In addition, FIG. 5 also represents plot (5) of a drop value when using, for example, a cover structure 30" illustrated in FIG. 7. FIG. 7 is a cross-sectional view illustrating an exemplary cover structure 30" used in the tests. As illustrated in FIG. 7, the cover structure 30" is provided with, for example, a cover member 32" which is inclined such that the side surface of the edge ring 8' is exposed to plasma. In the edge ring 8' illustrated in FIG. 7, ΔW=60 mm and ΔT=2.5 mm.

Comparing plots (2) and (5) represented in FIG. 5, plot (5) has a larger drop value than that of plot (2). Plots (2) and (5) represented in FIG. 5 differ from each other in that the side surface of the edge ring 8' is exposed to the plasma. That is, in the edge ring 8', the drop value changes as the area exposed to the plasma changes.

Figure 8A:
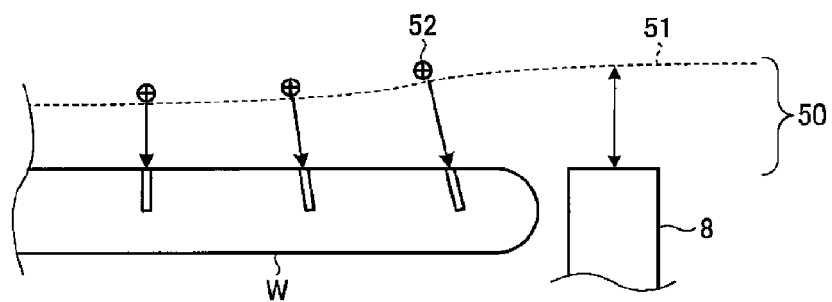
FIG. 8A is a diagram illustrating an exemplary distribution of the boundary of a sheath near the edge of a wafer.
Figure 8B:
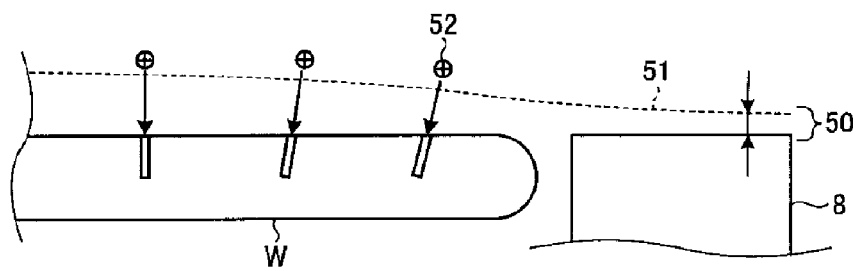
FIG. 8B is a diagram illustrating an exemplary distribution of the boundary of a sheath near the edge of a wafer.

FIGS. 8A and 8B are views each representing an exemplary distribution of the boundary 51 of a sheath area 50 in the vicinity of the edge of a wafer W. For example, as illustrated in FIG. 8A, when the area of the edge ring 8 exposed to plasma is small, it is considered that the sheath area 50 above the edge ring 8 becomes thicker. Therefore, the height of the boundary 51 of the sheath area 50 above the edge ring 8 is higher than the height of the boundary 51 of the sheath area 50 above the wafer W, and the incident direction of ions 52 is inclined toward the edge side of the wafer W. Therefore, in plot (2) when the side surface of the edge ring 8' is covered by the cover member 32' (see, e.g., FIG. 4), it is considered that the drop value becomes smaller and the shapes of the holes become outer-tilted.

Meanwhile, for example, as illustrated in FIG. 8B, when the area of the edge ring 8 exposed to plasma is large, it is considered that the sheath area 50 above the edge ring 8 becomes thinner Therefore, the height of the boundary 51 of the sheath area 50 above the edge ring 8 is lower than the height of the boundary 51 of the sheath area 50 above the wafer W, and the incident direction of ions 52 is inclined toward the center side of the wafer W. Therefore, in plot (5) when the side surface of the edge ring 8' is not covered by the cover member 32', it is considered that the drop value becomes larger and the shapes of the holes become inner-tilted.

When the area of the edge ring 8' exposed to the plasma is small, it is considered that the sheath area 50 above the edge ring 8' becomes thicker because the radio-frequency power per unit area flowing to the plasma through the edge ring 8' become larger. In addition, when the area of the edge ring 8' exposed to the plasma is large, it is considered that the sheath area 50 above the edge ring 8' becomes thinner because the radio-frequency power per unit area flowing to the plasma through the edge ring 8' become smaller.

Therefore, with the lapse of time in which the plasma processing is performed, the cover structure 30 of the present embodiment reduces the area of the edge ring 8 exposed to the plasma. This may make it possible to suppress the height of the boundary 51 of the sheath area 50 above the edge ring 8 from being reduced with the consumption of the edge ring 8. This may make it possible to suppress a change in the tilt angles of the holes formed in the wafer W.

Figure 9A:
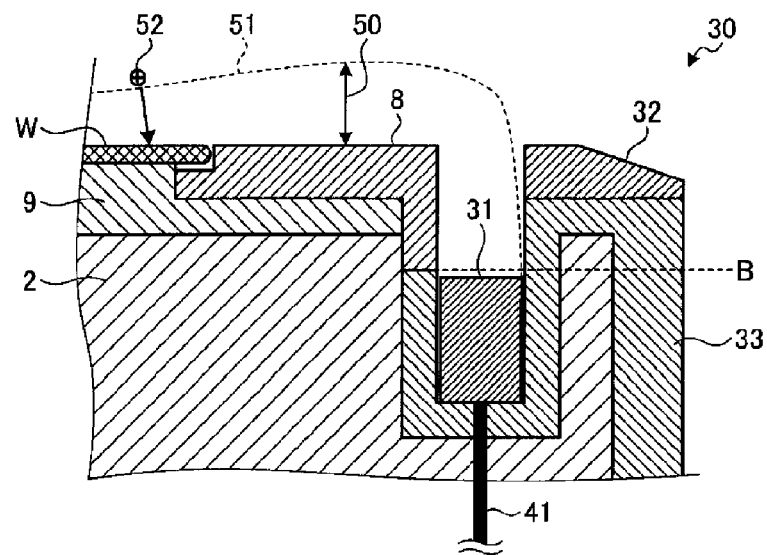
FIG. 9A is a view illustrating an exemplary relationship between the distribution of the boundary of a sheath and the position of a shielding member.

Specifically, for example, as represented in FIG. 9A, the position of the shielding member 31 is controlled such that the replaced edge ring 8 is in the state in which the shielding member 31 is retracted to the lowermost position, that is, in the state in which the edge ring 8 is not covered by the shielding member 31. In addition, as for the replaced edge ring 8, it is assumed that the edge ring 8 is consumed due to the subsequent plasma processing, and an edge ring 8 having a shape that becomes outer-tilted within the allowable range of tilt angles of holes may be used.

Figure 9B:
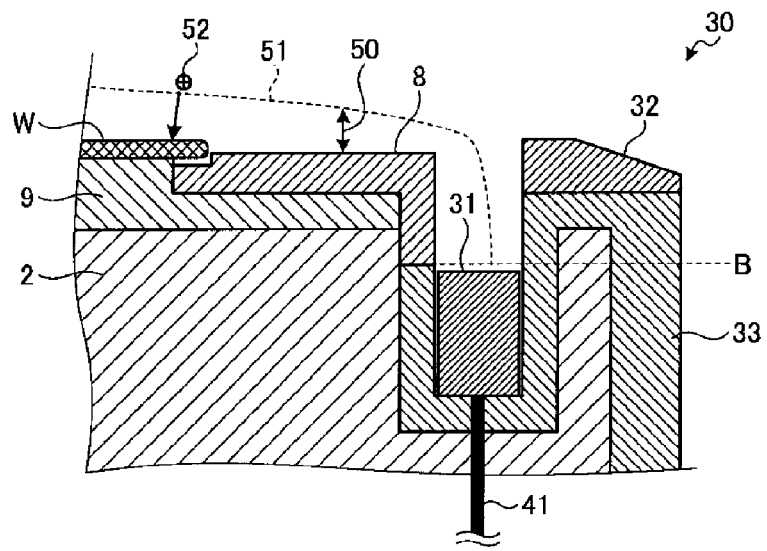
FIG. 9B is a view illustrating an exemplary relationship between the distribution of the boundary of a sheath and the position of a shielding member.

Then, with the lapse of a time in which the plasma processing is performed, the edge ring 8 is consumed, for example, as illustrated in FIG. 9B. In addition, the height of the boundary 51 of the sheath area 50 above the edge ring 8 becomes lower than the height of the boundary 51 of the sheath area 50 above the wafer W, and the incident angle of ions 52 is inclined toward the center side of the wafer W. Thus, the tilt angles of the holes formed in the wafer W become inner-tilted.

Figure 9C:
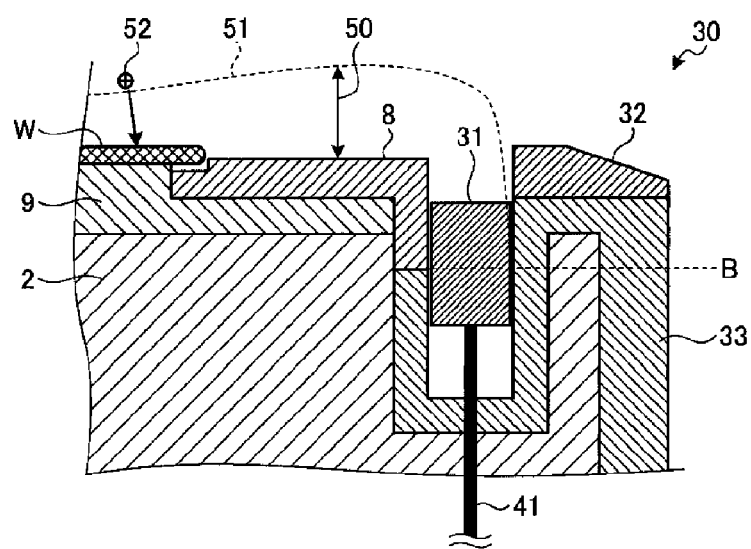
FIG. 9C is a view illustrating an exemplary relationship between the distribution of the boundary of a sheath and the position of a shielding member.

Accordingly, in the present embodiment, for example, as illustrated in FIG. 9C, the side surface of the edge ring 8 is covered with the shielding member 31 by raising the shielding member 31. Thus, the area exposed to the plasma in the edge ring 8 is reduced. Therefore, for example, as illustrated in FIG. 9C, the sheath area 50 above the edge ring 8 becomes thicker, and the height of the boundary 51 of the sheath area 50 above the edge ring 8 becomes higher than the height of the boundary of the sheath area 50 above the wafer W. Thus, the incident angle of ions 52 is inclined to the edge side of the wafer W, and the tilt angles of the holes formed in the wafer W become outer-tilted.

In addition, the thickness of the shielding member 31 in the radial direction of the wafer W may be thicker than the thickness of the sheath area 50 formed above the edge ring 8.

[Procedure of Plasma Processing]

Figure 10:
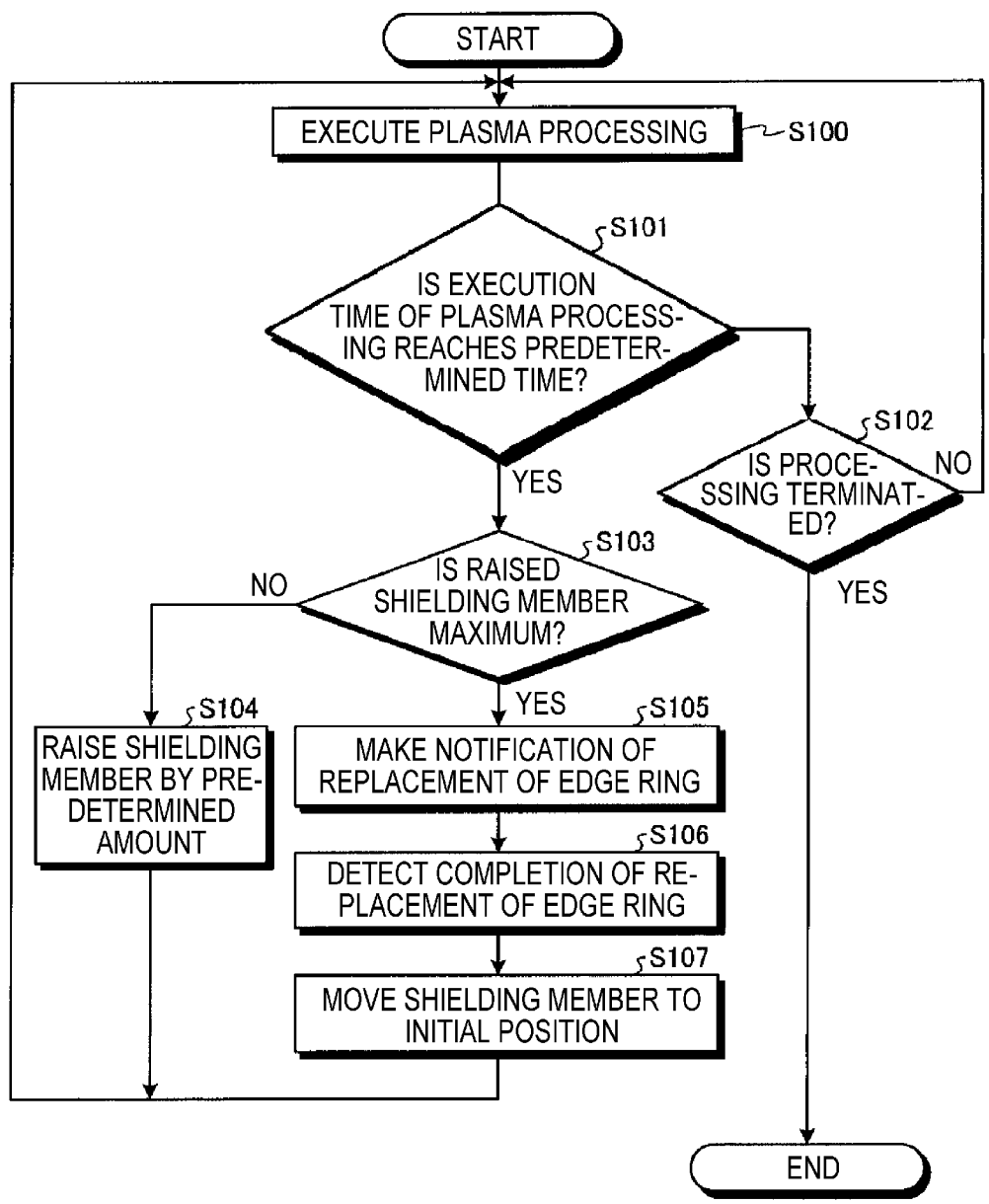
FIG. 10 is a flowchart illustrating an exemplary plasma processing.

FIG. 10 is a flowchart illustrating an exemplary plasma processing. The processing illustrated in FIG. 10 is mainly implemented by the control device 200 controlling each part of the apparatus body 300. In addition, as a premise that the processing illustrated in FIG. 10 is started, the shielding member 31 exists at the initial position which is the lowermost position.

First, the control device 200 performs a plasma processing on the wafer W by controlling the apparatus body 300 (S100). In step S100, for example, the gate valve G is opened, and an unprocessed wafer W is carried into the chamber 1 by a robot arm through the opening 1a. Then, the unprocessed wafer W is placed on the holding surface 9a of the electrostatic chuck 9, and the gate valve G is closed. The control device 200 causes the holding surface 9a of the electrostatic chuck 9 to attract and hold the wafer W by controlling the DC power supply 10. Then, the control device 200 evacuates the chamber 1 by operating the exhaust device 13.

In addition, the control device 200 adjusts the temperature of the fluid circulating in the flow path 4 of the base 2 by controlling a chiller unit (not illustrated). Further, the control device 200 controls the pressure of the heat transfer gas supplied to the space between the holding surface 9a of the electrostatic chuck 9 and the lower surface of the wafer W by controlling the flow rate controller (not illustrated) of the heat transfer gas. Thus, the wafer W is controlled to a predetermined temperature.

Next, the control device 200 supplies the respective processing gases into the shower head 14 by controlling the respective flow rate controllers 22. A processing gas supplied into the diffusion chamber 19 diffuses in the diffusion chamber 19, and is supplied from the respective gas discharge ports 17 into the chamber 1 in the form of a shower.

Next, the control device 200 applies radio-frequency power for plasma generation to the shower head 14 by controlling the radio-frequency power supply 16. The radio-frequency power applied to the shower head 14 is radiated into the chamber 1 from the lower surface of the shower head 14. Thus, the plasma of the processing gas is generated in the chamber 1.

In addition, the control device 200 applies radio-frequency power for bias to the base 2 by controlling the radio-frequency power supply 7. The ions in the plasma are drawn into the wafer W by the radio-frequency power applied to the base 2, and the surface of the wafer W is etched. Then, the gate valve G is opened, and the wafer W subjected to the plasma processing is carried out from the chamber 1. Then, an unprocessed wafer W is carried into the chamber 1 again, and the plasma processing is performed on the wafer W.

Next, the control device 200 determines whether or not the execution time of the plasma processing has reached a predetermined time (S101). The processing of step S101 may be performed each time the plasma processing is executed on one wafer W, or may be performed each time the plasma processing is executed on a predetermined number of wafers W. Alternatively, the processing of step S101 may be executed every predetermined time regardless of the number of wafers W on which the plasma processing is executed.

When the execution time of the plasma processing has not reached a predetermined time (S101: No), the control device 200 determines whether or not the processing of the wafer W is to be terminated (S102). When the processing of the wafer W is not terminated (S102: No), the control device 200 executes the processing illustrated in step S100 again. Meanwhile, when the processing of the wafer W is terminated (S102: Yes), the plasma processing illustrated in this flowchart is terminated.

Meanwhile, when the execution time of the plasma processing has reached the predetermined time (S101: Yes), the control device 200 determines whether or the raised amount of the shielding member 31 is maximum (S103). The state in which the raised amount of the shielding member 31 is maximum is the state in which the entire side surface of the edge ring 8 is covered by the shielding member 31, and for example, the state in which the height of the upper surface of the shielding member 31 is the same as or higher than the upper surface of the edge ring 8.

When the raised amount of the shielding member 31 is not maximum (S103: No), the control device 200 controls the driving device 40 to raise the shielding member 31 by a predetermined amount (S104). Thus, the boundary 51 of the sheath area 50 above the edge ring 8 lowered due to the consumption of the edge ring 8 is raised again, and the inclination of the tilt angles of holes formed in the wafer W is suppressed. Then, the control device 200 resets the accumulated value of the execution time of the plasma processing to 0, and executes the processing illustrated in step S100 again.

Meanwhile, when the raised amount of the shielding member 31 is maximum (S103: Yes), the control device 200 notifies an administrator of the plasma processing apparatus 100 of the replacement of the edge ring 8 (S105). Then, when detecting that the edge ring 8 is replaced (S106), the control device 200 controls the driving device 40 to move the shielding member 31 to the initial position (S107). Then, the control device 200 resets the accumulated value of the execution time of the plasma processing to 0, and executes the processing illustrated in step S100 again.

The embodiment of the plasma processing apparatus 100 has been described above. As apparent from the foregoing description, according to the plasma processing apparatus 100 of the present embodiment, the area to which the edge ring 8 is exposed to plasma is increased in response to the consumption of the edge ring 8 accompanying the lapse of the execution time of the plasma processing. Therefore, it is possible to suppress an increase in the tilt angle of a hole in the vicinity of the edge of the wafer W due to the consumption of the edge ring 8. This may make it possible to increase the replacement period of edge rings 8, and to improve the throughput of the process.

[Others]

The technology disclosed herein is not limited to the above-described embodiments, and various modifications are possible within the scope of the gist the present disclosure.

Figure 11:
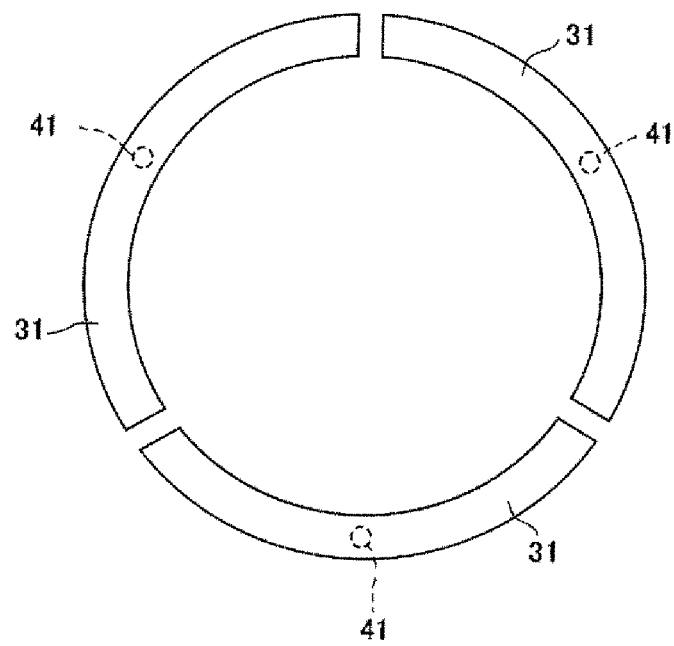
FIG. 11 is a plan view illustrating an exemplary shielding member including a plurality of partial shielding members.

For example, in the embodiments described above, the shielding member 31 is configured as a single member, but the disclosed technology is not limited thereto. FIG. 11 is a plan view illustrating the shielding member 31 including a plurality of partial shielding members according to an embodiment of the present disclosure. For example, as illustrated in FIG. 11, the shielding member 31 may have a plurality of partial shielding members divided in the circumferential direction of the edge ring 8. Each partial shielding member is supported by one or more support rods 41, and each support rod 41 moves up and down by the driving device 40. In addition, each partial shielding member may move up and down independently of each other. Therefore, it is possible to suppress the deviation of the boundary 51 of the sheath area 50 in the circumferential direction of the edge ring 8.

In the embodiment described above, the shielding member 31 is capable of shielding a portion of the surface of the edge ring 8 from plasma by covering the side surface of the edge ring 8 with respect to the plasma. However, the disclosed technology is not limited thereto, and it is possible to adopt a configuration capable of shielding a portion of the surface of edge ring 8 by another method as long as the configuration is capable of shielding a portion of the surface of the edge ring 8 from plasma.

According to various aspects and embodiments of the present disclosure, it is possible to suppress variation in the inclination of an etching shape formed on the workpiece as the edge ring is consumed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a plasma chamber;
a stage disposed in the plasma chamber and having a first portion and a second portion, the first portion supporting a workpiece, the second portion surrounding the first portion;
an edge ring made of a conductive material and disposed on the second portion of the stage, the edge ring having an outer sidewall;
upper and lower cover members made of an insulating material and disposed so as to surround the edge ring, the upper cover member being disposed on the lower cover member, the upper and lower cover members forming an inner sidewall facing the outer sidewall of the edge ring;
an annular shield member made of the insulating material and disposed between the outer sidewall of the edge ring and the inner sidewall of the upper and lower cover members, the annular shield member being retractable to a lowermost position in which an upper surface of the annular shield member is below a lower end of the edge ring and configured to shield a portion of the outer sidewall of the edge ring from a plasma generated in the plasma chamber; and a driver configured to vertically move the annular shield member relative to the edge ring and at least one of the upper and lower cover members, thereby changing an exposed area to the plasma of the outer sidewall of the edge ring.

2. The plasma processing apparatus according to claim 1, wherein the edge ring has a substantially cylindrical shape, the annular shield member has a substantially cylindrical shape and is disposed around the edge ring, and the driver is configured to move the annular shield member along a central axis of the edge ring, thereby changing an exposed area to the plasma of the outer side wall of the edge ring.

3. The plasma processing apparatus according to claim 2, wherein the edge ring includes a first ring portion around the first portion of the stage and a second ring portion extending parallel to the central axis of the edge ring, and the annular shield member protects at least a portion of an outer wall of the second ring portion from the plasma.

4. The plasma processing apparatus according to claim 3, wherein the annular shield member includes a plurality of shield segments discretely disposed in a circumferential direction of the edge ring, and the driver independently moves each of the shield segments relative to the edge ring.

5. The plasma processing apparatus according to claim 4, wherein the driver is configured to move the annular shield member relative to the edge ring such that the area of the outer sidewall of the edge ring exposed to the plasma decreases with a plasma processing time.

6. The plasma processing apparatus according to claim 5, further comprising:

a metal base supporting the stage, wherein the annular shield member is accommodated in a recess formed in the base.

7. The plasma processing apparatus according to claim 1, wherein the annular shield member includes a plurality of shield segments discretely disposed in a circumferential direction of the edge ring, and the driver independently moves the shield segments relative to the edge ring.

8. The plasma processing apparatus according to claim 1, wherein the driver is configured to move the annular shield member relative to the edge ring such that the area of the outer sidewall of the edge ring exposed to the plasma decreases with a plasma processing time.

9. The plasma processing apparatus according to claim 1, further comprising:

a metal base supporting the stage, wherein the annular shield member is accommodated in a recess formed in the base.

10. The plasma processing apparatus according to claim 1, wherein the annular shield member is connected to the driver with three or more support rods.

11. The plasma processing apparatus according to claim 1, wherein the annular shield member comprises quartz.

12. The plasma processing apparatus according to claim 1, wherein a thickness of the annular shield member in a radial direction of the workpiece is larger than a thickness of a sheath area defined above the edge ring.

13. The plasma processing apparatus according to claim 1, wherein the edge ring comprises at least one of silicon, carbon, or SiC, and the upper cover member, the lower cover member, and the annular shield member comprise quartz.

14. The plasma processing apparatus according to claim 1, wherein the driver is configured to vertically move the annular shield member upward relative to the edge ring and at least one of the upper and lower cover members, thereby decreasing an exposed area to the plasma of the outer sidewall of the edge ring with a plasma processing time.

15. The plasma processing apparatus according to claim 1, wherein the annular shield member substantially contacts at least a portion of the outer sidewall of the edge ring.

16. The plasma processing apparatus according to claim 1, wherein the exposed area to the plasma of the outer sidewall of the edge ring is decreased as the annular shield member moves upward from the lowermost position.

17. A plasma processing apparatus comprising:

a plasma chamber;

a stage disposed in the plasma chamber;

an edge ring made of a conductive material and disposed on the stage so as to surround a wafer disposed on the stage, the edge ring having an outer sidewall;

at least one cover member made of a first insulating material and disposed so as to surround the edge ring, the at least one cover member having an inner sidewall facing the outer sidewall of the edge ring;

an annular member made of a second insulating material and disposed between the outer sidewall of the edge ring and the inner sidewall of the at least one cover member, the annular member being retractable to a lowermost position in which an upper surface of the annular member is below a lower end of the edge ring; and a driver configured to vertically move the annular member relative to the edge ring and the at least one cover member, thereby changing an exposed area of the outer sidewall of the edge ring.

18. The plasma processing apparatus according to claim 17, wherein the edge ring comprises at least one of silicon, carbon, or SiC, and the annular member comprises quartz.

19. The plasma processing apparatus according to claim 17, wherein the exposed area of the outer sidewall of the edge ring is decreased as the annular member moves upward from the lowermost position.

* * * * *